United States Patent [19]

Bickley et al.

[11] Patent Number: 4,994,757
[45] Date of Patent: Feb. 19, 1991

[54] EFFICIENCY IMPROVEMENT OF POWER AMPLIFIERS

[75] Inventors: Robert H. Bickley; Richard A. Bory, both of Scottsdale, Ariz.

[73] Assignee: Motorola, Inc., Schaumburg, Ill.

[21] Appl. No.: 430,034

[22] Filed: Nov. 1, 1989

[51] Int. Cl.$^5$ .............................................. H03G 3/30
[52] U.S. Cl. .................................... 330/285; 330/133; 330/134; 330/137; 455/93; 455/126; 455/127
[58] Field of Search ............... 330/133, 134, 137, 285; 455/93, 116, 127, 126

[56] References Cited

U.S. PATENT DOCUMENTS

| | | | |
|---|---|---|---|
| 3,486,128 | 12/1969 | Lohrmann | 330/285 |
| 3,828,270 | 8/1974 | Ebisch | 330/137 X |
| 4,044,308 | 8/1977 | Stites et al. | 332/155 X |
| 4,442,407 | 4/1984 | Apel | 455/127 X |

Primary Examiner—James B. Mullins
Attorney, Agent, or Firm—Maurice J. Jones

[57] ABSTRACT

Circuitry changes the magnitude of power supply voltages to correspond to the desired level of a variable output power. This maximizes the electrical power efficiency of amplifiers. The circuitry also provides for automatic control of the amplitude of the amplifier output signal.

12 Claims, 4 Drawing Sheets 4,994,757

EFFICIENCY IMPROVEMENT OF POWER AMPLIFIERS

BACKGROUND OF THE INVENTION

The subject invention relates to improving the electrical efficiency of amplifiers and particularly of power amplifiers providing output signals having a plurality of different power levels.

Many types of modern electronic equipment employ power amplifiers. More specifically, radio frequency (RF) power amplifiers are utilized in transmitters to increase the power level of amplitude modulated (AM) signals, for example, wherein the magnitude of a fixed frequency carrier signal is continuously varied in accordance with the instantaneous magnitude of a lower frequency modulating signal. The relative magnitudes of the modulating signal and the carrier signal define a percentage of AM. 100% AM occurs when the magnitude of the modulating signal causes the magnitude of the carrier to vary from zero to twice the quiescent magnitude of the carrier signal. Such power amplifiers must be designed to deliver the peak envelope power (PEP) which occurs at 100% AM.

Power amplifiers are also used to increase the power level of frequency modulated (FM) signals wherein the amount of frequency deviation of a carrier signal varies with the amplitude of a modulating signal. The power level of a FM signal doesn't vary with the amplitude of the modulating signal but does vary with the carrier amplitude.

Design of power amplifiers typically involves determining the optimum load resistance which provides a predetermined maximum output power with a particular power supply voltage of a constant direct current (DC) magnitude. When such power amplifiers are then operated at less than the predetermined maximum output power, reduced average efficiency occurs. Efficiency can be defined as the RF power out of an amplifier divided by the DC power into the amplifier. The portion of the DC power not changed into RF output power is changed into undesirable heat by the power amplifier. This heat increases the thermal stress on the RF power transistors therein and also results in higher chassis temperatures. The heating of RF power transistors causes metal migration therein which tends to reduce the lifetime of such transistors, for instance. Increased chassis temperature tends to cause undesirable thermally generated effects on other amplifier components which can either require additional compensation circuitry or cause malfunctions.

Moreover, the reduced efficiency undesirably drains the batteries of battery operated equipment such as portable radios. For instance, it is sometimes required to switch FM or phase modulated (PM) or other signal transmitting equipment to different power or carrier levels to preserve batteries or to reduce interference with other spectrum users. These prior art transmitters or amplifiers having power supply voltages of fixed magnitudes tend to operate inefficiently when operated at a variety of output power levels.

SUMMARY OF THE INVENTION

Accordingly, it is an object of the present invention to increase the efficiency of amplifiers suitable for providing output signals having a variety of power levels.

In carrying out the above and other objects of the invention in one form, there is provided a power amplifier system which includes a power converter coupled to an amplifier and to a variable reference voltage supply. The power converter provides variable supply voltages to the amplifier having magnitudes that vary with the variable reference voltage. More specifically, the reference voltage supply is adapted to provide reference voltages to the power converter having a plurality of magnitudes that vary with the desired magnitude of the amplifier output signal. The power converter responds to these reference voltages to provide supply voltages to the amplifier having different magnitudes to facilitate efficient operation of the amplifier.

For instance, the reference voltage level can be amplitude modulated in phase synchronism with the amplitude modulation of an amplifier input signal. Alternatively, the reference voltage level can also be adjusted between different discrete levels so that the power supply voltages correspond to different desired amplifier FM, PM or other signal output power levels to provide increased electrical efficiency. In either case, an automatic level controlling circuitry can also be employed to regulate the amplitude of the output signal to desired levels.

BRIEF DESCRIPTION OF THE DRAWINGS

A more complete understanding of the present invention may be derived by reference to the detailed description and the claims when considered along with the accompanying drawings wherein like reference numbers designate similar parts.

DETAILED DESCRIPTION OF THE PREFERRED EMBODIMENT

Figure 1:
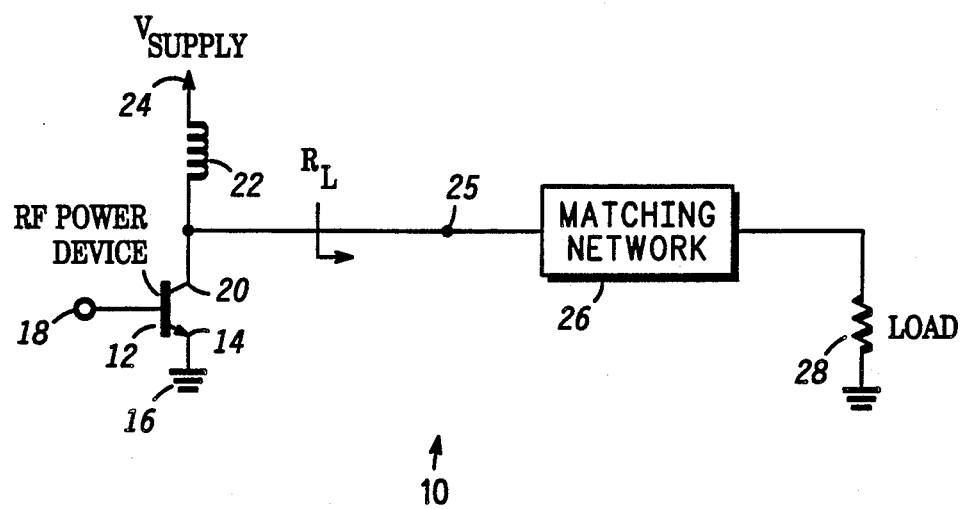
FIG. 1 is a schematic diagram of an amplifier.

Referring now to the drawings, FIG. 1 is a schematic diagram of a RF amplifier 10 which is useful in explaining the operation of embodiments in accordance with the invention. FIG. 1 shows a power amplifying NPN transistor 12 having an emitter electrode 14 connected to relatively negative power supply conductor 16. Base electrode 18 of transistor 12 is adapted to receive an RF signal to be amplified. Collector electrode 20 of transistor 12 is coupled through RF blocking inductor 22 to a power supply conductor 24 which provides a relatively positive power supply potential. Collector 20 is also connected through matching network 26 to an electrical load 28.

If power amplifier 10 is optimized for efficient operation, the output power, $P_{OUT}$ can be calculated by the following formula:

$$P_{OUT}_{(WATTS)} = \frac{\left(\dfrac{V_{SUPPLY} - V_{SAT}}{\sqrt{2}}\right)^2}{R_L} = \frac{(V_{RMS})^2}{R_L} \quad \text{Equation (1)}$$

$V_{SUPPLY}$ is the voltage between power supply terminals 16 and 24, $R_L$ is the real value of the impedance looking into input terminal 25 of matching network 26, $V_{SAT}$ is the saturated RF voltage drop across the emitter-to-collector of transistor 12. Given a fixed value for $V_{SUPPLY}$, $R_L$ can be calculated to provide a $P_{OUT}$ equal to the maximum peak envelope power of the output signal, according to the following equation:

$$R_L = \frac{\left(\dfrac{V_{SUPPLY} - V_{SAT}}{\sqrt{2}}\right)^2}{P_{OUT}} \quad \text{Equation (2)}$$

If the percentage of amplitude modulation, for instance, is reduced then given a fixed load resistance and a fixed power supply potential, the operating efficiency of amplifier 10 is undesirably reduced. Also, if the amplitude of a FM carrier signal is reduced while the power supply voltage remains constant, the efficiency is undesirably decreased.

In accordance with the invention, for AM the magnitude of the power supply voltage, $V_{SUPPLY}$ is modulated by the modulating signal so that the power amplifier operates efficiently at different percentages of modulation which provide different values of output power. This desirable result is accomplished by modulating the power supply voltage magnitude with the same signal that is utilized to amplitude modulate the input signal applied to input terminal 18 of transistor 12, for instance. As shown by Equation (2) for a given fixed value of load resistance $R_L$, it is desirable for the magnitude of the power supply voltage $V_{SUPPLY}$ to decrease when the magnitude of the $P_{OUT}$ decreases and to increase when the magnitude of the $P_{OUT}$ increases. $P_{OUT}$ is, therefore, proportional to the percentage of amplitude modulation or the peak amplitude of an FM signal.

Figure 2:
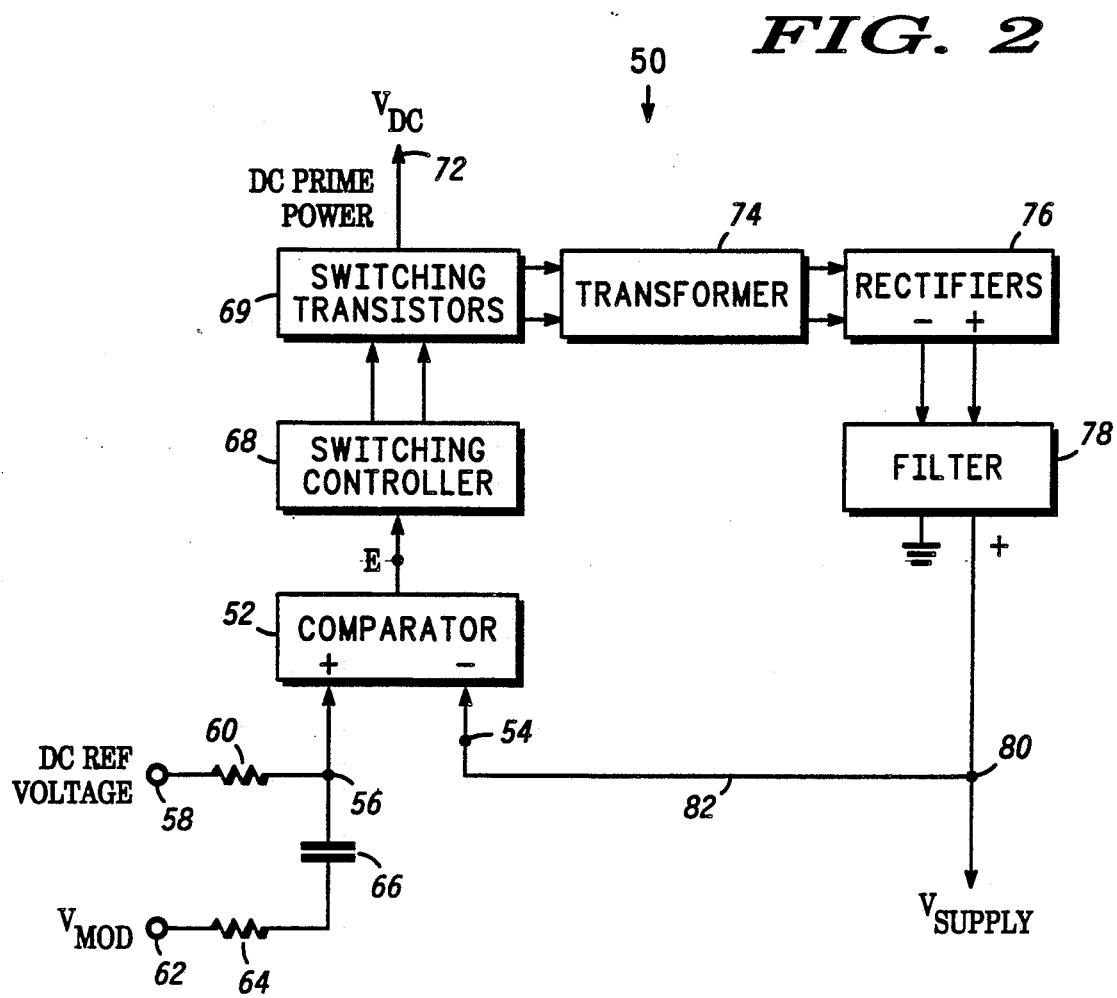
FIG. 2 is a block diagram of a modulated or adjustable power converter.

FIG. 2 shows a block diagram of a power supply or power converter circuit 50 for providing a power supply voltage having a magnitude that can be adjusted or modulated. Switching power converter circuit 50 includes a comparator 52 having an inverting input terminal 54 and a non-inverting input terminal 56. A DC reference voltage of variable magnitude, which can be provided by a variable voltage regulator of known configuration, is applied to reference input terminal 58 and through resistor 60 to terminal 56 of comparator 52. Furthermore, a modulating signal $V_{MOD}$ is applied to input terminal 56 through terminal 62, resistor 64, and DC blocking capacitor 66. The output of comparator 52 is applied to the input of switching controller 68 which controls transistorized switching circuit 69 of known configuration. Switching circuit 69 receives a substantially fixed or constant power supply potential applied through prime power supply conductor 72. Transformer 74 is connected between switching circuit 69 and rectifiers 76. Filter 78 is connected between rectifiers 76 and power converter output terminal 80 which provides the modulated or adjustable power supply voltage, $V_{SUPPLY}$ for a power amplifier such as power amplifier 10 of FIG. 1 or 144 Of FIG. 4. Terminal 80 of circuit 50 is Coupled through feedback conductor 82 to the non-inverting input terminal 54 of comparator 52.

In AM operation, the modulating signal, $V_{MOD}$ applied to terminal 62 is superimposed on a fixed DC reference voltage coupled to input terminal 56. The feedback loop including conductor 82 provides a feedback signal having the magnitude of $V_{SUPPLY}$ from terminal 80 to input 54 of comparator 52. This feedback enables the magnitude of the output voltage on terminal 80 to be regulated to the instantaneous magnitude of the modulating voltage, $V_{MOD}$ plus the fixed DC reference level. In the case of carrier level adjustment for FM the magnitude of the output voltage on terminal 80 is adjusted to the sum of a DC level adjusting signal plus the DC reference level. There is, however, a small delay provided by converter 50 between the change of $V_{MOD}$ plus the reference at terminal 56 and the resulting change in $V_{SUPPLY}$ at terminal 80, for instance. This delay, which provides a small amount of phase difference between these signals, varies proportionately with the frequency of $V_{MOD}$. Accordingly, the magnitude of the supply voltage on terminal 80 is modulated by $V_{MOD}$ for AM or varies with the level adjusting signal for FM.

Figure 3:
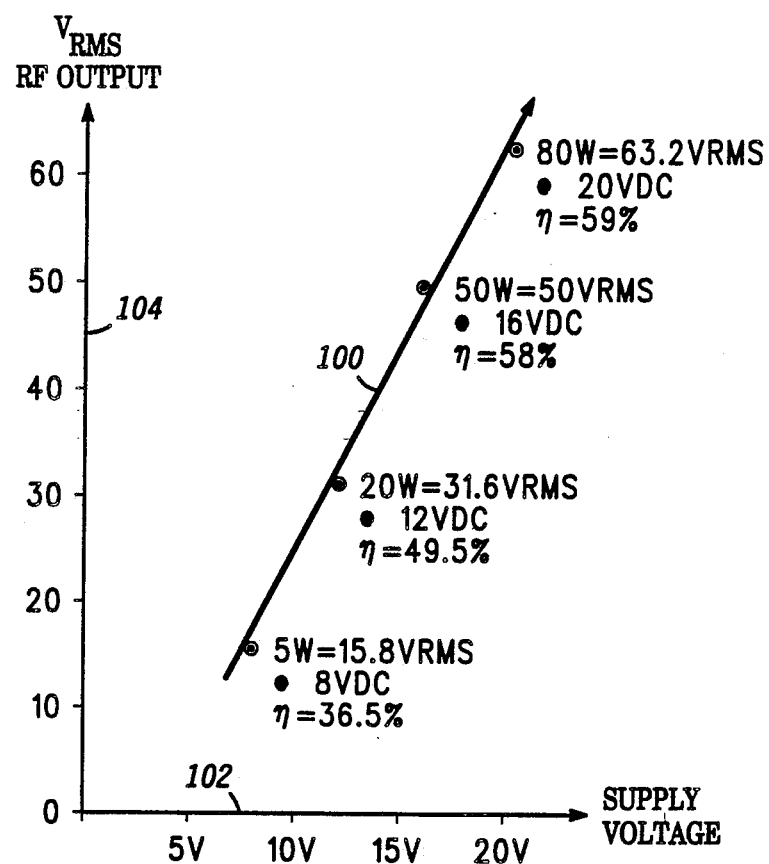
FIG. 3 is a graph of RF output voltage versus supply voltage illustrating corresponding values providing maximized efficiency.

FIG. 3 shows a plot 100 of data taken on a particular amplifier to verify that for maximum efficiency, the optimum supply voltage as measured along abscissa 102 is directly related to the RMS RF output voltage of a power amplifier, as measured along ordinate axis 104. The symbol "$\eta$" represents efficiency. As indicated by FIG. 3, the efficiency $\eta$ tends to increase with increased supply voltage because the effect of the saturation voltage of the power amplifier transistor or transistors tends to be relatively reduced as the magnitude of the supply voltage increases.

Figure 4:
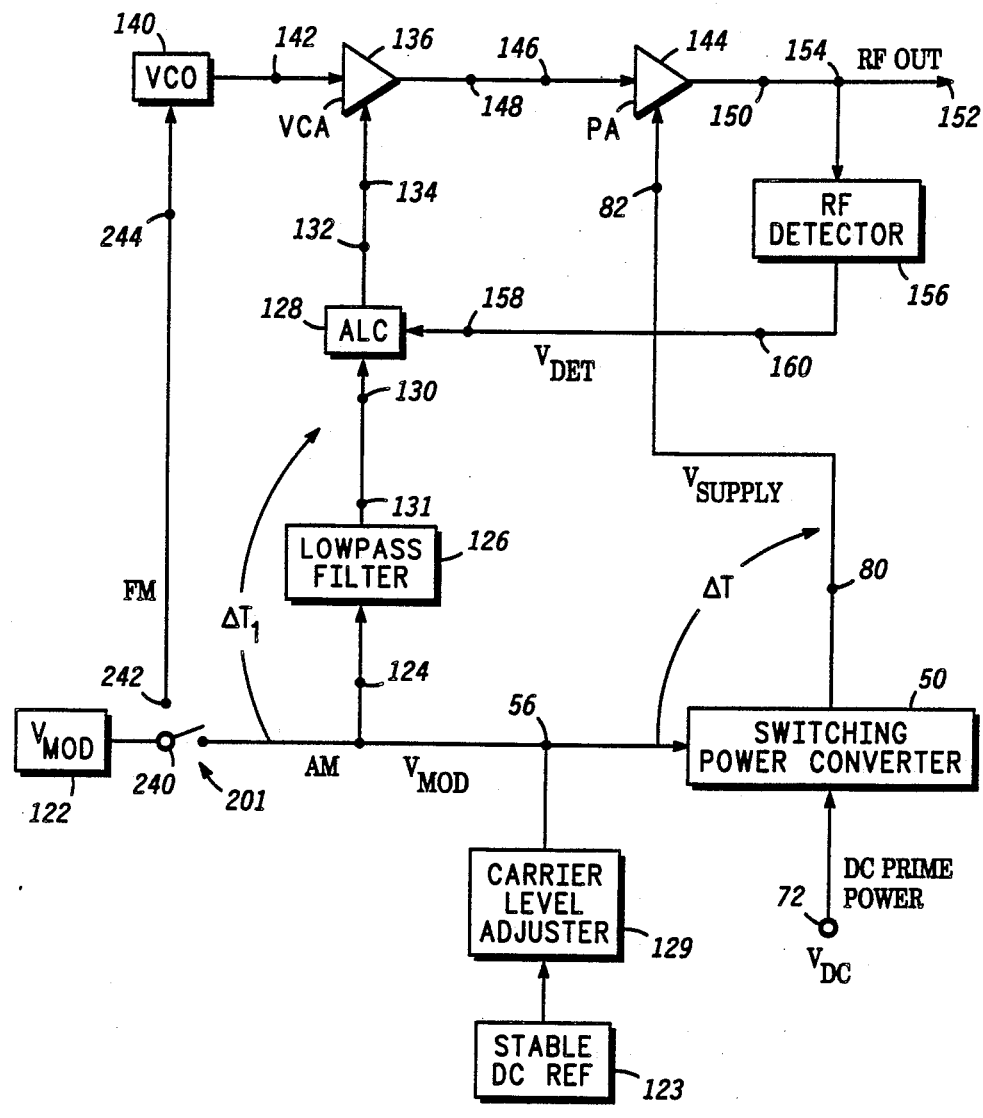
FIG. 4 is a block diagram of a transmitter having a power amplifier system employing a modulated or adjustable switching power converter.

FIG. 4 is a block diagram of a transmitter 120 which is switchable between AM and FM modes of operation. Transmitter 120 includes modulated or adjustable power converter 50 of FIG. 2. Transmitter 120 also includes a source 122 of amplitude or frequency modulating signals, $V_{MOD}$ which may be a microphone, for instance. Source 122 can be considered to provide a low or audio frequency (AF) sinusoidal signal. If switch 240 is operated to a first position making connection with terminal 201, the output, $V_{MOD}$ of modulating signal source 122, along with the output of carrier level adjuster 129, is connected to input terminal 56 of the switching power converter 50 and to input terminal 124 of low pass filter 126. Automatic level controller or comparator 128 has a first input terminal 130 connected to the output terminal 131 of filter 126. The output terminal 132 of automatic level controller 128 is connected to control terminal 134 of voltage controlled amplifier 136. RF signal source 140 which may be a voltage controlled oscillator (VCO) is connected to input terminal 142 of voltage controlled amplifier 136. VCO 140 provides a fixed frequency carrier so long as the magnitude of a control voltage applied to terminal 244 remains constant. The gain of voltage controlled amplifier 136 is varied by changing the magnitude of the control signals applied to terminal 134. When $V_{MOD}$ is applied to control terminal 134 through filter 126 and automatic level control 128, then AM of a fixed frequency RF signal from source or supply 140 results. When switch 240 is operated to a second position to contact terminal 242, then $V_{MOD}$ is applied to control terminal 244 of VCO 140. FM of the RF signal from source 140 results at terminals 142, 148 and 150. Either for AM or FM the magnitude of the reference level at terminal 56 determines the carrier amplitude at terminal 148. Carrier level adjuster 129 is connected to receive a stable reference from regulator 123 and varies the DC reference level on terminal 156.

Power amplifier 144 has an input terminal 146 connected to the output terminal 148 of voltage controlled amplifier (VCA) 136. Output terminal 150 of power amplifier (PA) 144 is connected to RF output terminal 152 which may be connected to an antenna (not shown), for instance, and to input terminal 154 of RF detector 156. Power amplifier 144 increases the power level of the signal from voltage controlled amplifier 136. In the case of AM, detector 156 recovers or demodulates the signal $V_{MOD}$ from a portion of the Output of power amplifier 144. Control terminal 158 of automatic level control circuitry 128 is connected to receive $V_{MOD}$ from the output terminal 160 of RF detector 156. In the case of FM, detector 156 provides an output signal at terminal 160 which has a magnitude indicative of the magnitude of the FM carrier. Automatic level control 128 compares the instantaneous level of the signal at terminal 160 of detector 156 with instantaneous level of the signal on terminal 130 to provide an error signal at output 132. The error signal controls the gain of voltage controlled amplifier 136. Thus, automatic level control 128 controls the RF carrier level of the signals at terminal 148 of voltage controlled amplifier regardless of whether transmitter 120 is operated in the AM or the FM mode. Hence, the amplitude of the modulated output signal at terminal 154 is controlled by the level from circuit 122 plus the level from circuit 129. Level adjuster 129 can be a potentiometer or an analog-to-digital converter. Level adjuster 129 can provide any one of a plurality of DC levels which effects the carrier magnitude and the supply voltage at terminal 80. Reference 123 provides a stable reference voltage to level adjuster 129.

Figures 5A, 5B, 5C, 5D:
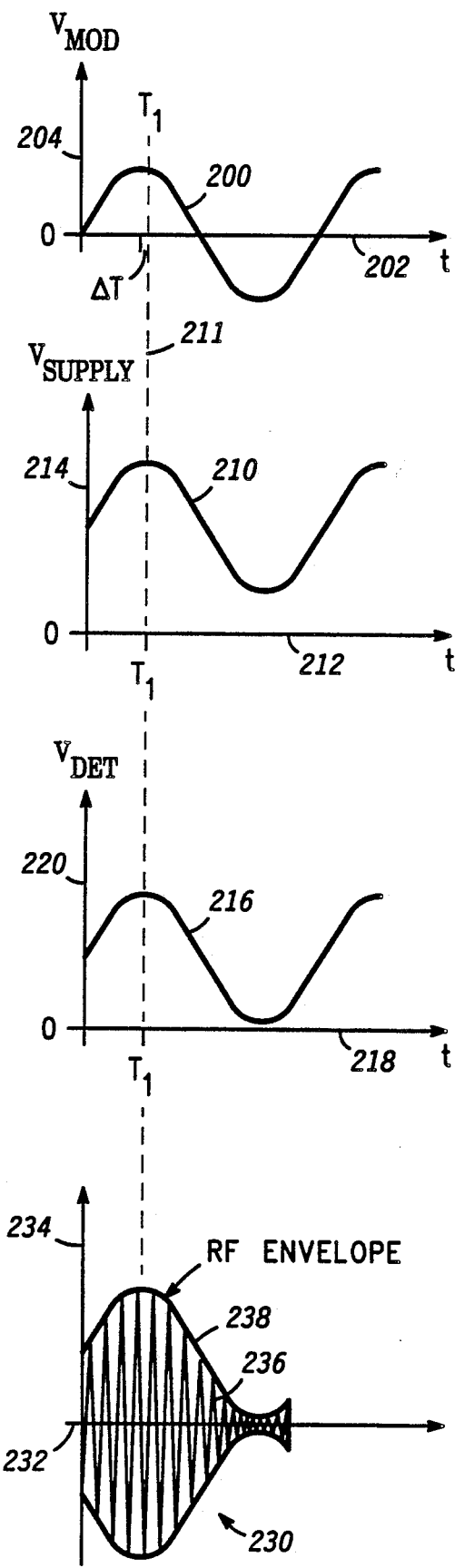
FIGS. 5A through 5D illustrate waveforms at various nodes in the system of FIG. 4.

For AM, FIG. 5A shows waveform 200 which occurs at output terminal 201 of $V_{MOD}$ 122. The modulation frequency can be as high as approximately 10 Kilohertz. Switching power converter or DC-to-DC converter 50 operates efficiently with an effective switching frequency of 1 MHz. Thus, converter 50 responds rapidly to change the supply voltage at terminal 80 of FIG. 4 in accordance with the modulating voltage. Abscissa axis 202 of FIG. 5A indicates time and ordinate axis 204 indicates magnitude. Waveform 200 is shown as a simple sinusoid to facilitate explanation.

FIG. 5B shows waveform 210 of an amplitude modulated power supply voltage of power amplifier 14 occurring at output terminal 80 of power converter 50. Abscissa axis 212 of FIG. 5B indicates time and ordinate axis 214 indicates voltage magnitude. Waveform 210 varies in frequency with waveform 200, however, waveform 210 is biased above abscissa 212 by the fixed DC reference voltage supplied to terminal 56 of converter 50, as previously described. A slight time delay $\Delta T$ between the positive peaks of waveform 200 and 210 is indicated by dashed line 211 of FIGS. 5A and 5B.

FIG. 5C shows $V_{MOD}$ waveform 216 occurring at output terminal 160 of detector 156 which corresponds in amplitude and phase with delayed $V_{MOD}$ waveform 210. Abscissa axis 218 of FIG. 5C indicates time and ordinate axis 220 indicates magnitude. FIG. 5D shows AM RF waveform 230 occurring at power amplifier output terminal 150. Abscissa axis 232 of FIG. 5D shows time and ordinate axis 234 shows amplitude. Modulated RF signal 236 is amplitude modulated by audio frequency signal 200 to provide envelope 238.

Low pass filter 126 assures that the time delay ($\Delta T_1$) of the modulating signal 200 for AM or changed carrier amplitude adjusting level, in the case of FM, applied to terminal 130 of automatic level control 128 and the time delay ($\Delta T$) of the modulated power supply voltage are equal. Thus, the envelope 238 of FIG. 5D is kept in phase with modulated power supply waveform 210 of FIG. 5B, as shown by dashed line 211.

DC reference supply 123 in cooperation with level adjuster 129 is adapted to provide a reference voltage having a controllable magnitude for use in battery-operated FM transmitters which may be required to operate at reduced power in order to increase battery life or avoid interference with other transmitters. Transmitter 120 provides FM by enabling $V_{MOD}$ to vary the frequency of the carrier signal from source 140 rather than $V_{MOD}$ varying the amplitude of the carrier signal from source 140. By controlling the reference voltage and thereby controlling the supply voltage magnitude, the efficiency for the FM transmitter can be optimized at reduced as well as at maximum output power levels thereby tending to extend the battery life, for instance.

Figure 6:
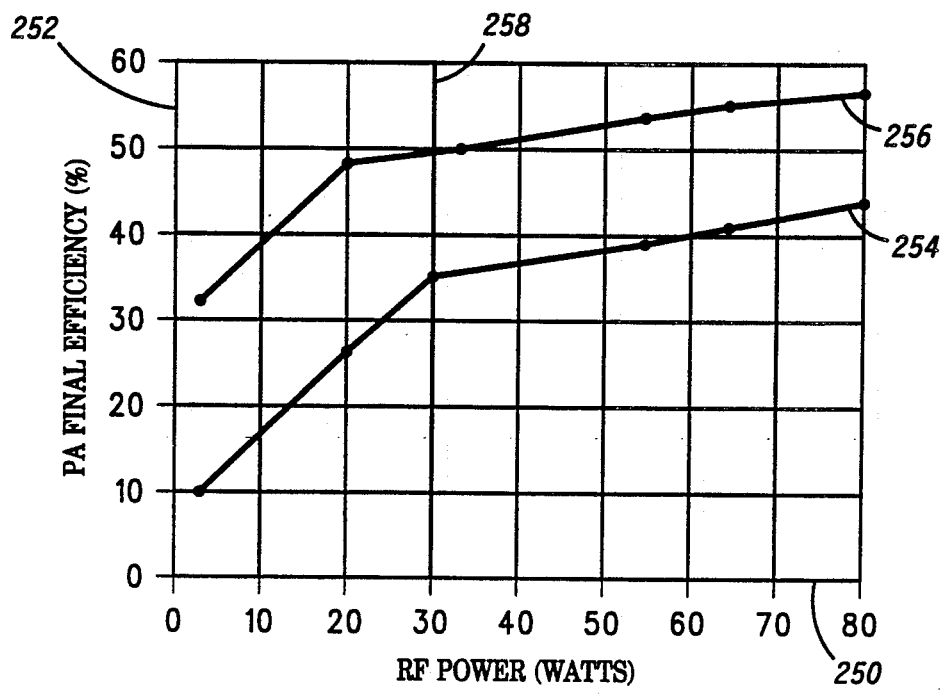
FIG. 6 show graphs comparing power amplifier efficiencies as a function of RF output power for a power amplifier having a power supply voltage of constant magnitude and a power supply voltage of variable magnitude.

The charts or graphs shown of FIG. 6 illustrate the improvement in efficiency provided by modulating or changing the power supply voltage in accordance with the required amplifier output power or voltage. More particularly, FIG. 6 indicates RF output power in watts along abscissa axis 250 and power amplifier final efficiency in percentage along ordinate axis 252. The lower graph 254 shows the efficiency characteristic of a particular amplifier with a power supply voltage having a constant magnitude of 28 volts and an amplifier "load line" optimized for 140 watts.

The upper graph 256 shows the efficiency characteristic of the same amplifier with a variable supply voltage. The supply voltage magnitude was reduced for lower output powers and increased for higher output powers Accordingly, the power amplifier produced efficiencies 256 which are greater than those indicated by graph 254 for the amplifier having a supply voltage of a constant magnitude. The efficiencies of both graphs 254 and 256 constantly increase as the RF power is increased because of the lessening effect of the saturation voltages of the RF power amplifier transistors, as previously mentioned.

If operating in the AM mode, the RF carrier magnitude level makes excursions up and down the output power curve. The AM efficiency is the time average value of efficiency which is greater on the upper curve or graph 256 than the efficiency on the lower curve or graph 254. Vertical line 258 indicates the increase in efficiency in the power amplifier if operated in the FM mode at a output power of 30 watts. More specifically, if the power supply voltage is reduced an appropriate amount, the efficiency is increased from approximately 32 percent to 50 percent, as shown by line 258. Hence, in either the FM or AM mode, the battery life of mobile equipment can be extended by employing the present invention. Also, the increased efficiency reduces otherwise undesirable heating effects.

Structures and methods have been described which facilitate change in the magnitude of power supply voltage and/or carrier level in accordance with output power requirements so that amplifiers provide maximum efficiency. Also, the carrier level is regulated in accordance with the power supply voltage to further maximize efficiency of amplifier operation. These techniques can be utilized for any type of amplifier where efficiency is important. While the invention has been described in conjunction with specific embodiments thereof, it is evident that many alterations, modifications and variations will be apparent to those skilled in the art in light of the aforegoing description. Accordingly, the invention is intended to embrace all such alterations, modifications and variations in the appended claims.

We claim:

1. A power amplifier for efficiently increasing the electrical power of an amplitude modulated input signal having varying percentages of modulation to provide an output signal having a plurality of power levels, the power amplifier including in combination:
    amplifying electron control means;
    power supply means coupled to said electron control means, said power supply means providing supply voltages to said electron control means;
    reference supply means coupled to said power supply means, said reference supply means providing reference voltages to said power supply means;
    modulating signal supply means coupled to said reference supply means for amplitude modulating said reference voltage so that said power supply means provides an amplitude modulated supply voltage to said electron control means, said amplitude modulated supply voltage having varying percentages of modulation in accordance with the varying percentages of modulation of said amplitude modulated input signal; and
    first circuit means having phase synchronization means, said first circuit means coupling said modulating signal supply means to said amplifying electron control means, said phase synchronizing means synchronizing the phases of said amplitude modulated supply voltage and the amplitude modulation of the input signal to facilitate efficient operation of the power amplifier.

2. The power amplifier of claim 1 wherein the phase of said amplitude modulated power supply voltage tends to undesirably lag the phase of the modulated input signal by a predetermined amount of time, the power amplifier means further including:
    input carrier signal supply means;
    modulating means coupled between said input signal supply means and said electron control means; and
    said phase synchronizing means having filter means coupled between said modulating signal supply means and said modulating means, said filter means delaying the amplitude modulation of said input signal by the predetermined amount of time so that the phase of the amplitude modulated input signal is synchronized with the phase of said amplitude modulated supply voltage.

3. The power amplifier means of claim 2, further including:
    detector means coupled to receive the amplifier output signal;
    second circuit means coupling said reference supply means to said filter means; and
    said first circuit means further including level control means coupled between said detector means, said filter means and said electron control means, said level control means being responsive to output signals from said detector means and said filter means to control the level of the amplifier output signal.

4. The power amplifier of claim 3, wherein said reference supply means includes carrier level adjuster means.

5. The power amplifier of claim 1 wherein said power supply means includes:
    comparator means having a first and second inputs, said first input coupled to said reference supply means;
    switching means coupled to said comparator means;
    transforming means coupled to said switching means;
    rectifying means coupled to said transforming means;
    filter means coupled to said rectifying means; and
    feedback means coupled between said filter means and said second input of said comparing means.

6. The power amplifier of claim 1 wherein said amplifying electron control means includes a transistor.

7. The power amplifier of claim 1 further including:
    detector means coupled to receive and detect the output signal of the amplifying electron control means to provide a level indicator signal; and
    level control means coupled between said reference supply means, said detector means and said amplifying electron control means, said level control means comparing the amplitude of said level indicating signal to said reference voltage to provide a level control signal; and
    further means responsive to said level control signal to control the amplitude of the power amplifier output signal.

8. A modulating amplifier system suitable for efficient electrical power utilization and for providing amplitude modulated output signals having any one of a plurality of different power levels, including in combination:
    first signal supply means providing a carrier signal at an output terminal thereof;
    voltage controlled amplifier means having input, output and control terminals, said input terminal of said voltage controlled amplifier means being coupled to said output terminal of said first signal supply means;
    amplifier means having input, output and power supply terminals, said input terminal of said amplifier means being coupled to said output terminal of said voltage controlled amplifier means;
    second signal supply means providing a modulating signal at an output terminal thereof;
    filter means with input and output terminals, said input terminal of said filter means being coupled to said output terminal of said second signal supply means, said filter means providing a delayed modulating signal which is delayed by a predetermined amount at said output terminal thereof;
    first circuit means coupling said output terminal of said filter means to said control terminal of said voltage controlled amplifier means, said voltage controlled amplifier modulating said carrier signal with said delayed modulating signal;
    power converter means having control and output terminals, said power converter means providing a power supply voltage at said output terminal thereof;
    second circuit means coupling said output terminal of said power converter means to said power supply terminal of said amplifier means;

third circuit means coupling said output terminal of said second signal supply means to apply said modulating signal to said control terminal of said power converter means to thereby modulate said power supply voltage, said power converter means also providing said predetermined amount of delay between the phase of the modulating signal and said modulated power supply voltage so that the phase of the amplitude modulation of the carrier signal is synchronous with the phase of the modulated power supply voltage to facilitate the efficient operation of the amplifier system.

9. The modulating amplifier system of claim 8, further including:

adjustable control signal means having an output terminal, said adjustable control signal means providing first control signals at said output terminal thereof with a magnitude that varies according to desired output power level of the output signal; and fourth circuit means coupling said control terminal of said power converter means to said output terminal of said adjustable control signal means so that said power converter means can provide any one of a plurality of power supply voltages having different levels to said amplifier means to facilitate efficient power utilization by the amplifier system.

10. The modulating amplifier system of claim 9 wherein:

said first circuit means includes level control means having first input, second input and output terminals, said first input terminal of said level control means being coupled to said output terminal of said filter means, said output terminal of said level control means being coupled to said control terminal of said voltage controlled amplifier means; and detector means coupled between said output terminal of said amplifier means and said second input terminal of said level control means, said detector means demodulating said modulated carrier signal to provide a demodulated signal to said second input terminal of said level control means, said level control means comparing the instantaneous level of said demodulated signal with the instantaneous level of said delayed modulating signal, said level control means providing second control signals to said control terminal of said voltage controlled amplifier means to control the level of said modulated signal.

11. The modulating amplifier system of claim 9, further including:

level control means having first input, second input and output terminals, said first input terminal of said level control means being coupled to said output terminal of said adjustable control signal means, said output terminal of said level control means being coupled to said control terminal of said voltage controlled amplifier means; and detector means coupled between said output terminal of said amplifier means and said second input terminal of said level control means, said detector means providing a level indicating signal to said second input terminal of said level control means, said level control means comparing the instantaneous level of said level indicating signal with the instantaneous level of said first control signals, said level control means providing second control signals to said control terminal of said voltage controlled amplifier to control the level of the amplifier system output signal.

12. The modulating amplifier of claim 8 wherein said power converter means includes:

comparator means having first and second inputs, said first input being coupled to said second signal supply;

switch means coupled to said comparator means;

transformer means coupled to said switch means;

rectifier means coupled to said transformer means;

filter means coupled to said rectifier means; and feedback means coupled between said filter means and said second input of said comparator means.

* * * * *